United States Patent
Lee

(10) Patent No.: US 8,198,145 B2
(45) Date of Patent: Jun. 12, 2012

(54) METHOD OF MANUFACTURING SEMICONDUCTOR DEVICE OVER SOI SUBSTRATE

(75) Inventor: Jae Yeon Lee, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 231 days.

(21) Appl. No.: 12/495,708

(22) Filed: Jun. 30, 2009

(65) Prior Publication Data

US 2010/0052054 A1    Mar. 4, 2010

(30) Foreign Application Priority Data

Sep. 1, 2008   (KR) .................. 10-2008-0085854

(51) Int. Cl.
*H01L 21/00* (2006.01)

(52) U.S. Cl. ........ 438/149; 438/157; 438/479; 438/517; 257/E21.415

(58) Field of Classification Search .......... 438/299–307, 438/149, 479–480, 517
See application file for complete search history.

(56) References Cited

U.S. PATENT DOCUMENTS

| | | | | |
|---|---|---|---|---|
| 6,797,556 | B2 * | 9/2004 | Murthy et al. | 438/231 |
| 7,026,199 | B2 * | 4/2006 | Lee | 438/157 |
| 7,534,706 | B2 * | 5/2009 | Boyd | 438/574 |
| 7,622,337 | B2 | 11/2009 | Park | |

FOREIGN PATENT DOCUMENTS

| | | |
|---|---|---|
| JP | 08-153688 | 6/1996 |
| JP | 2008-053403 A | 3/2008 |
| KR | 1020030082820 A | 10/2003 |

* cited by examiner

*Primary Examiner* — Thanh Nguyen

(57) ABSTRACT

The present invention relates to a method of manufacturing a semiconductor memory device and a semiconductor memory device manufactured using the same. A method of manufacturing a semiconductor device comprises defining source/drain regions in semiconductor substrate through an etch process using a mask, and forming a gate and source/drain by depositing a conductive material over the defined regions and the semiconductor substrate and patterning the conductive material.

9 Claims, 4 Drawing Sheets

METHOD OF MANUFACTURING SEMICONDUCTOR DEVICE OVER SOI SUBSTRATE

CROSS-REFERENCE TO RELATED APPLICATION

The present application claims priority to Korean patent application number 10-2008-0085854, filed on Sep. 1, 2008, which is incorporated by reference in its entirety.

BACKGROUND OF THE INVENTION

The present invention relates to a method of manufacturing a semiconductor device and, more particularly, to a technology related to a process of forming transistors for a high-integrated semiconductor memory device using a Silicon-On-Insulator (SOI) substrate.

In a system including a plurality of electronic components, a semiconductor memory device is used to store data. When a data processing device (e.g., a Central Processing Unit (CPU)) requests data, a semiconductor memory device outputs stored data corresponding to an address received from a data request apparatus.

With an increase in the data storage capacity of a semiconductor memory device, the size of a unit cell has gradually decreased and the size of an element for a read or write operation has also decreased. Accordingly, it is important to minimize the area occupied by elements (e.g., wirings or transistors), by integrating the elements. Further, in order to further increase the degree of integration, it is necessary to reduce the size of each of unit cells within the semiconductor memory device.

For example, in Dynamic Random Access Memory (DRAM) (i.e., a type of volatile memory device capable of storing data as long as power is applied) from among semiconductor memory devices, a unit cell within the semiconductor memory device includes one transistor and one capacitor. The area (i.e., footprint) where the capacitor is formed has decreased with a decrease in the design rule. In order to overcome this problem and increase the electrostatic capacitance of the capacitor, an effort is being made to develop a semiconductor device constituting an insulating layer within the capacitor, but have encountered many difficulties. The decrease of the design rule makes it difficult to perform normal read and write operations because the value of junction resistance at a storage node SN within the unit cell and the turn-on resistance value of the transistor rise, resulting in a poor refresh property.

An improved unit cell within a semiconductor memory device has been proposed, which includes a transistor having a floating body. In other words, a capacitor used to store data is not included in the unit cell of the semiconductor memory device, but floating in the body of the transistor within the unit cell. The floating body transistors are implemented on a general semiconductor substrate formed of a single silicon layer, but are implemented on an SOI substrate in which an insulating layer is interposed between the silicon layers.

The floating body transistors formed in the silicon layers over the insulating layer are separated from each other by an isolation layer. If the SOI substrate is used, junction capacitance occurring between the silicon layer and the floating body transistor is greatly decreased as compared with a general semiconductor substrate. Accordingly, RC delay of the transistor occurring because of resistance and capacitance can be reduced. Further, subsequent processes for manufacturing a semiconductor memory device are identical to those of the known art except that the semiconductor substrate is replaced with the SOI substrate.

BRIEF SUMMARY OF THE INVENTION

Various embodiments of the invention are directed to providing a method of manufacturing a semiconductor memory device and a semiconductor memory device manufactured using the same, wherein, in a process of forming the source/drain regions of a floating body transistor, the source/drain regions are etched through an etch process using a mask, so that neighboring floating body transistors can be electrically isolated from each other and the length of an effective channel can be increased.

According to an aspect of the present invention, a method of manufacturing a semiconductor device comprises defining source/drain regions in semiconductor substrate through an etch process using a mask, and forming a gate and source/drain by depositing a conductive material over the defined regions and the semiconductor substrate and patterning the conductive material.

Preferably, if the semiconductor substrate is a Silicon On Insulator (SOI) substrate, the etch process is carried out until a buried insulating layer within the SOI substrate is exposed.

Preferably, the method further comprises depositing a gate oxide layer over the semiconductor substrate before the etch process is carried out.

Preferably, the forming-a-gate-and-a-source-and-a-drain-by-depositing-a-conductive-material-over-the-defined-regions-and-the-semiconductor-substrate-and-patterning-the-conductive-material includes depositing the conductive material on the defined regions and the gate oxide layer, depositing a gate insulating layer on the conductive material, etching the conductive material and the gate insulating layer to expose the gate oxide layer using a mask defining the gate, and forming a spacer on sidewalls of the conductive material and the insulating layer.

Preferably, the method further comprises defining the source/drain by performing annealing and ion implantation processes, and forming landing plugs on the respective source/drain.

Preferably, the forming-landing-plugs-on-the-respective-source-and-drain includes etching part of the conductive material filling the etched spaces, forming a plug insulating layer in the gate oxide layer and an exposed upper silicon layer, and forming the landing plugs between the plug insulating layer and the spacer over the conductive material.

Preferably, if the gate is formed of a plurality of electrodes including a lower gate electrode and an upper gate electrode, the source/drain are made of a same material as the lower gate electrode.

According to another aspect of the present invention, a semiconductor device comprises a channel region defined in a semiconductor substrate, a gate oxide layer formed over the channel region, a gate pattern formed over the channel region, and a source/drain made of a same material as a gate electrode within the gate pattern.

Preferably, if the semiconductor substrate is an SOI substrate, the source and the drain come into contact with a buried insulating layer within the SOI substrate.

Preferably, if the gate pattern is formed of a plurality of electrodes including a lower gate electrode and an upper gate electrode, the source/drain and the lower gate electrode comprise a same material.

Preferably, the source/drain and the lower gate electrode comprise polysilicon.

Preferably, the gate pattern comprises a stack structure of the gate electrode and a gate insulating layer and a spacer formed on sidewalls of the stack structure.

Preferably, the semiconductor device further comprises a plug insulating layer formed between the spacer and the source/drain, and landing plugs formed on the respective source/drain between the spacer and the plug insulating layer.

Preferably, the plug insulating layer is a nitride layer.

According to yet another aspect of the present invention, a method of manufacturing a semiconductor device comprises defining source/drain regions by etching an upper silicon layer over an SOI substrate by an etch process using a mask, depositing a conductive material and a gate insulating layer over the defined regions and the SOI substrate, separating a gate pattern and a source/drain by patterning the conductive material and the gate insulating layer, forming a plug insulating layer between the gate pattern and the source/drain, and forming landing plugs on the respective source/drain.

Preferably, the conductive material comprises polysilicon.

Preferably, the forming-a-plug-insulating-layer-between-the-gate-pattern-and-the-source/drain includes forming a spacer on sidewalls of the gate pattern, etching part of the source/drain, defining the source/drain by performing annealing and ion implantation processes, and covering a gate oxide layer and an upper silicon layer, exposed between the spacer and the source/drain, with a nitride layer.

DESCRIPTION OF EMBODIMENT

Hereinafter, an embodiment of the present disclosure will be described in detail with reference to accompanying drawings.

A semiconductor memory device using a floating body effect is first described.

Figure 1A:
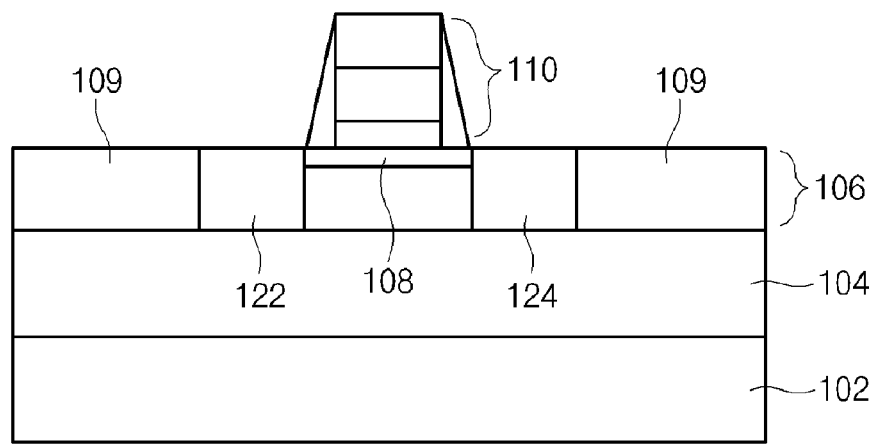
FIGS. 1a and 1b are cross-sectional views of a floating body transistor within a semiconductor device formed in a SOI substrate.
Figure 1B:
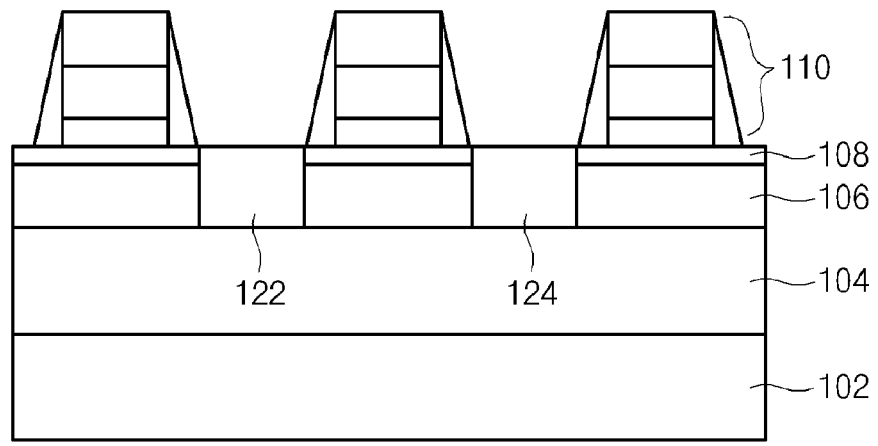

FIGS. 1a and 1b are cross-sectional views of a floating body transistor within a semiconductor device formed in a SOI substrate.

Referring to FIG. 1a, a floating transistor is formed in an SOI substrate, including a lower semiconductor substrate 102, a buried insulating layer 104, and an upper silicon layer 106. The upper silicon layer 106 remains in an active region, and the active regions are isolated from each other by an isolation layer 109. A gate oxide layer 108 is deposited on the active region, and a gate pattern 110 is formed on the gate oxide layer 108. A source region 122 and a drain region 124 are placed on both sides of the gate pattern 110.

Referring to FIG. 1b, a plurality of floating body transistors are formed in the respective upper silicon layer 106 of the SOI substrate. It can be seen that each of the floating body transistors are separated from each other by the source/drain regions 122 and 124 and the buried insulating layer 104 below the upper silicon layer 106. The source/drain regions 122 and 124 may be formed from polysilicon and then annealed. Accordingly, the floating body transistor can store a floating charge (i.e., data) in the transistor body (i.e., the upper silicon layers 106 placed under the respective gate patterns 110).

The principle of storing data in the floating body transistor is described below. When a gate voltage and a drain voltage are respectively applied to the gate pattern 110 and the drain region 124 of the floating body transistor, a channel is formed under the gate pattern 110. Hot carriers caused by the collision of impurity ions are then generated at a region where the channel comes into contact with the drain region 124. Here, electrons of the generated electrons and holes exit through the drain region 124 (i.e., a conduction region), but the holes remain and are accumulated in the upper silicon layer 106. The accumulated holes cause to change an electric potential of the transistor body. If voltage is subsequently applied to the gate pattern 110, the amount of current flowing through the floating body transistor varies depending on whether accumulated holes exist or not. Accordingly, whether data "0" or "1" is stored in the floating body transistor can be determined based on a change in the amount of current (i.e., the threshold voltage).

The above-described semiconductor device structure may have a low degree of integration of semiconductor devices because the active regions are defined by the isolation layers 109 formed of a field oxide layer. Further, in an annealing process performed when forming the source/drain regions of each of the floating body transistors, the diffusion of an impurity is wider in silicon than in polysilicon. Thus, if the diffusion of an impurity is not sufficient, neighboring floating body transistors through the source/drain regions may not be electrically connected to each other. However, if the diffusion of an impurity is excessive, the impurity is excessively diffused into the silicon layer placed under the gate pattern, and so the channel length of the floating body transistor may become short. If a semiconductor memory device is manufactured using the known method as described above, it is difficult to control the channel length of a floating body transistor.

In a method of manufacturing a semiconductor device according to an embodiment of the present invention, regions where the source/drain of the semiconductor device will be formed are defined through an etch process using a mask. A gate electrode material is deposited and patterned, thereby forming a source/drain. The source and the drain are formed through an annealing process and an ion implantation process. A contact and a plug are formed so that they are electrically coupled to wiring formed of an upper metal layer.

FIGS. 2a to 2e are cross-sectional views showing a method of manufacturing floating body transistors according to an embodiment of the present invention.

Figure 2A:
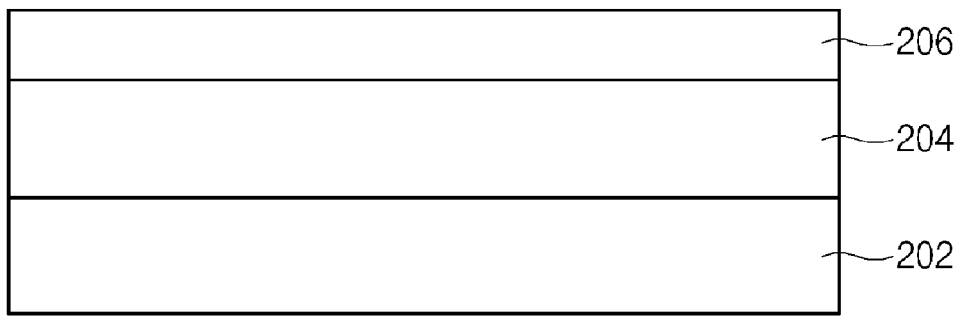
FIGS. 2a to 2e are cross-sectional views showing a method of manufacturing floating body transistors within semiconductor memory devices according to an exemplary embodiment of the present invention.

Referring to FIG. 2a, in order to form floating body transistors according to an embodiment of the present invention, an SOI substrate, including a lower silicon layer 202, a buried insulating layer 204, and an upper silicon layer 206, is formed.

Figure 2B:
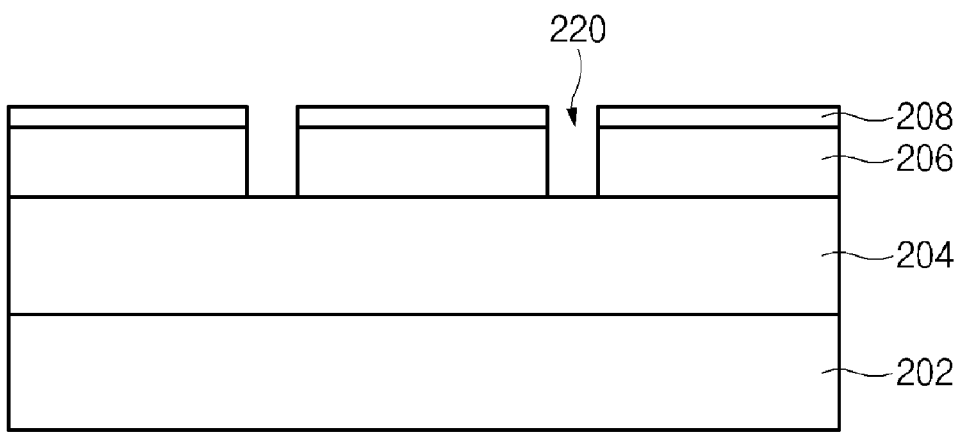

Referring to FIG. 2b, a gate oxide layer 208 is deposited on the upper silicon layer 206 of the SOI substrate. A photoresist layer (not shown) is coated on the gate oxide layer 208 and then patterned using a mask for defining source/drain regions. Trenches 220 for a source and drain are formed by etching the gate oxide layer 208 and the upper silicon layer 206 of the SOI substrate using the patterned photoresist layer (not shown) as an etch mask so that the buried insulating layer 204 of the SOI substrate is exposed.

Figure 2C:
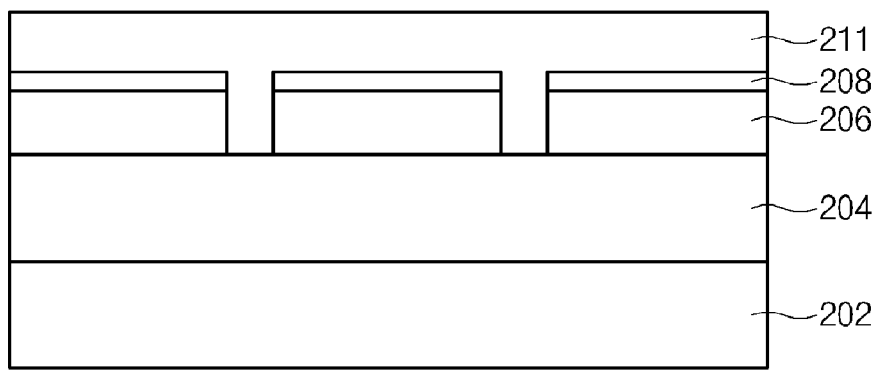

Referring to FIG. 2c, a conductive material 211 for gate electrodes is deposited on the gate oxide layer 208 including the trenches 220. Here, the conductive material 211 may be made of polysilicon.

In the case where a plurality of gate electrodes is formed, the same layer deposited in the trenches 220 may also be used to form a lower gate electrode. A second conductive layer (not shown) for forming an upper gate electrode is formed on the conductive material 211. An insulating layer (not shown) is formed on the second conductive layer.

Figure 2D:
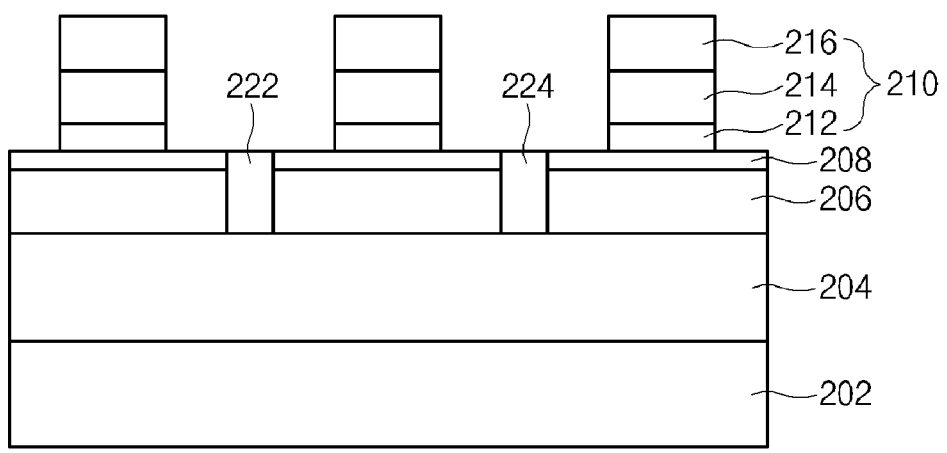

Referring to FIG. 2d, a plurality of the layers including the conductive material 211 for gate electrodes is patterned by an etch process using a mask defining the gate electrodes. Here, the conductive material 211 for gate electrodes is patterned and separated into a lower gate electrode 212 and source/drain 222 and 224. The second conductive layer formed on the conductive material 211 for gate electrodes is patterned to become upper gate electrodes 214. The insulating layer on the second conductive layer is patterned to become gate insulating layers 216.

Figure 2E:
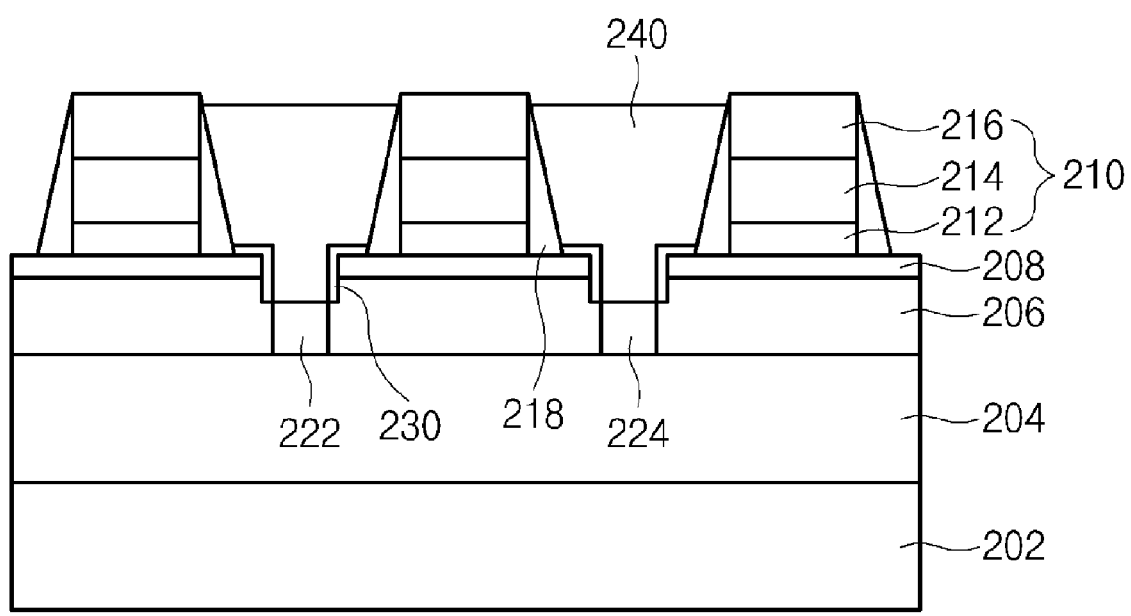

Referring to FIG. 2e, a spacer 218 is formed on the sidewalls of the lower gate electrode 212, the upper gate electrode 214, and the gate insulating layer 216, thereby completing gate patterns 210. Next, part of a top of the source/drain 222 and 224 is etched.

Next, an annealing and ion implantation are carried out, so that resistance between the source/drain 222 and 224 having the conductive material deposited thereon and the upper silicon layer 206 having a channel region formed therein and the source/drain are defined. Accordingly, the distance between the source/drain 222 and 224 can be extended because a U-shaped channel region is formed.

The upper silicon layer 206 and the gate oxide layer 208, exposed by the etching, are covered with a plug insulating layer 230. Here, a nitride layer is used as the plug insulating layer 230. Next, landing plugs 240 are formed on the respective source/drain 222 and 224. The bottom of the landing plug 240 comes into contact with the source/drain 222 and 224. The channel region 206 is insulated from the gate electrodes 212 and 214 by the plug insulating layer 230 and the spacer 218.

Unlike a known method of forming the source/drain on both sides of each of the gate patterns through ion implantation after the gate patterns are formed, in the method of manufacturing semiconductor devices according to the embodiment of the present invention, the source/drain regions are first defined in the semiconductor substrate through an etch process using the mask. The conductive material is deposited on the defined regions and the semiconductor substrate and then patterned, thereby forming the gates and the sources/drains. Each of the semiconductor devices formed by the above process includes the channel region defined in the semiconductor substrate, the gate oxide layer formed on the channel region, the gate pattern formed on the channel region, and the source/drain formed using the same material as the gate electrode within the gate pattern.

Accordingly, the semiconductor device according to the present invention can minimize the movement of carriers between neighboring floating body transistors because the source/drain 222 and 224 are formed in the trenches 220 through which the buried insulating layer 204 is exposed by the etching of the upper silicon layer 206. In other words, the floating body transistor can function to store holes, corresponding to input data, in the floating body including the upper silicon layer 206 under the gate pattern 210 and can prevent holes, remaining in the floating body, from moving toward neighboring floating body transistors through the source/drain 222 and 224 made of a conductive material.

Furthermore, in the semiconductor device according to the embodiment of the present invention, the length of the channel formed under the gate oxide layer 208 through the application of voltage to the gate electrodes has a three-dimensional structure not a horizontal structure. That is, the source/drain 222 and 224 do not have the same height as the gate oxide layer 208, but have a height lower than that of the gate oxide layer 208. Accordingly, the channel formed between the source/drain 222 and 224 is not flat, but three-dimensional under the plug insulating layer 230 and the gate oxide layer 208. Consequently, a short channel effect, such as punch-through, can be prevented because a longer effective channel length can be secured as compared with a known art.

According to the embodiment of the present invention, the source/drain regions of the floating body transistor are formed by etching away part of the source/drain regions. Accordingly, there is an advantage in that a short channel effect, such as punch-through, can be reduced because an effective channel length can be increased.

Furthermore, the source/drain regions are formed by an etch process using a mask as compared with self-aligned etching using the gate pattern of the floating body transistor. Accordingly, an interference effect between neighboring floating body transistors can be minimized because they are electrically isolated from each other more easily.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, comprising:
    etching a semiconductor layer to define first and second trenches; and
    providing conductive material over the semiconductor layer and in the first and second trenches, the conductive material provided in the first and second trenches being used to define first and second source/drain regions, and the conductive material provided between the trenches being used to define part of a gate electrode,
    wherein the semiconductor layer is a Silicon On Insulator (SOI) substrate, and the semiconductor layer is etched until a buried insulating layer provided below the semiconductor layer is exposed.

2. The method according to claim 1, further comprising, forming a gate dielectric layer over the semiconductor layer before etching the semiconductor layer.

3. The method according to claim 2, the method further comprising:
    forming a gate insulating layer over the conductive material;
    etching the conductive material and the gate insulating layer to expose the gate dielectric layer; and
    forming a spacer over sidewalls of the conductive material and the gate insulating layer.

4. The method according to claim 1, further comprising:
    defining the first and second source/drain regions by performing annealing and ion implantation processes; and
    forming landing plugs over the respective source/drain.

5. The method according to claim 4, wherein the forming-landing-plugs-on-the-respective-source-and-drain includes:
    etching a portion of the conductive material in the first and second trenches to form first and second minor trenches, respectively;
    forming a plug insulating layer over the gate dielectric layer and a portion of the semiconductor layer exposed by the first and second minor trenches; and forming the landing plugs between the plug insulating layer and the spacer over the conductive material, the landing plugs filling the first and second minor trenches.

6. The method according to claim 1, wherein the gate is formed of a plurality of electrodes including a lower gate electrode and an upper gate electrode, and
wherein the first and second source/drain regions are made of substantially the same material as the lower gate electrode.

7. A method of manufacturing a semiconductor device, comprising:
defining source/drain regions by etching an upper silicon layer of an SOI substrate by an etch process;
depositing a conductive material and a gate insulating layer over the defined regions and the SOI substrate;
separating a gate pattern and a source/drain by patterning the conductive material and the gate insulating layer;
forming a plug insulating layer between the gate pattern and the source/drain regions; and
forming landing plugs on the respective source/drain regions.

8. The method according to claim 7, wherein the conductive material comprises polysilicon.

9. The method according to claim 7, wherein the forming-a-plug-insulating-layer-between-the-gate-pattern-and-the-source/drain-regions includes:
forming a spacer on sidewalls of the gate pattern;
etching part of the source/drain regions;
defining the source/drain regions by performing annealing and ion implantation processes; and
forming a nitride layer over a gate oxide layer and the upper silicon layer, exposed between the spacer and the source/drain region.

* * * * *